United States Patent
Ota et al.

(10) Patent No.: US 6,656,022 B2
(45) Date of Patent: Dec. 2, 2003

(54) METHOD FOR POLISHING A SEMICONDUCTOR SUBSTRATE MEMBER

(75) Inventors: Katsuhiro Ota, Yokohama (JP); Akio Saito, Fujisawa (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/940,881

(22) Filed: Aug. 29, 2001

(65) Prior Publication Data

US 2002/0090894 A1 Jul. 11, 2002

Related U.S. Application Data

(62) Division of application No. 09/797,940, filed on Mar. 5, 2001.

(51) Int. Cl.$^7$ ................................. B24B 1/00
(52) U.S. Cl. ........................... 451/41; 451/36; 451/53; 451/60; 451/63; 216/88; 216/89; 57/307; 106/3
(58) Field of Search ................... 451/36, 41, 53, 451/60, 63; 216/88, 89; 57/307; 438/692, 693; 106/3, 491, 450, 499

(56) References Cited

U.S. PATENT DOCUMENTS

| | | |
|---|---|---|
| 4,956,015 A | 9/1990 | Okajima et al. |
| 4,959,113 A | 9/1990 | Roberts |
| 5,114,437 A | 5/1992 | Takeuchi et al. |
| 5,968,238 A | 10/1999 | Healy |
| 5,993,686 A | 11/1999 | Streinz et al. |
| 6,083,840 A | 7/2000 | Mravic |
| 6,177,026 B1 | 1/2001 | Wang et al. |
| 6,270,393 B1 * | 8/2001 | Kubota et al. ................ 451/36 |
| 6,293,851 B1 | 9/2001 | Molnar |
| 6,294,106 B1 * | 9/2001 | Pryor ........................ 252/79.1 |
| 6,354,913 B1 | 3/2002 | Miyashita et al. |
| 6,375,545 B1 | 4/2002 | Yano et al. |
| 6,379,406 B1 * | 4/2002 | Thomas et al. ................ 106/3 |

FOREIGN PATENT DOCUMENTS

| | | |
|---|---|---|
| EP | 0919602 A1 | 6/1999 |
| JP | 9-22885 | 1/1997 |
| JP | 10-102037 | 4/1998 |
| JP | 11-111657 | 4/1999 |
| KR | 0219787 | 9/1999 |
| KR | 10-2000-0028886 | 5/2000 |
| WO | WO 97/47430 | 12/1997 |

* cited by examiner

Primary Examiner—Joseph J. Hail, III
Assistant Examiner—Alvin J Grant
(74) Attorney, Agent, or Firm—Antonelli, Terry, Stout & Kraus, LLP

(57) ABSTRACT

A polishing slurry prepared by dispersing in a dispersion medium, abrasive grains comprised of a material having a solubility in the dispersion medium at 25° C., of 0.001 g/100 g or higher is used to effectively remove any abrasive grains standing adherent to the surfaces of objects to be polished or the interiors of polishing apparatus after polishing.

11 Claims, 2 Drawing Sheets

METHOD FOR POLISHING A SEMICONDUCTOR SUBSTRATE MEMBER

This application is a Divisional application of application Ser. No. 09/797,940, filed Mar. 5, 2001.

This application is based on Japanese Patent Application No. 2000-164650 filed in Japan, the contents of which are incorporated hereinto by reference.

BACKGROUND OF THE INVENTION

1. Field of the Invention

This invention relates to a polishing slurry suited for the polishing of electronic materials, magnetic materials and optical materials, a polishing method using the polishing slurry, and a process for fablicating semiconductor devices.

2. Description of the Related Art

In recent years, in order to achieve higher integration of semiconductor integrated circuits, wiring techniques more and more trend toward finer and more multilayered wiring. This has brought about a tendency toward a larger difference in height of interlayer insulating films. Because of this difference in height of interlayer insulating films, any wiring formed thereon may have a low processing precision and a low reliability. Hence, polishing techniques for improving smoothness of interlayer insulating films have become very important. For example, Japanese Patent Application Laid-open No. 9-22885 discloses chemical mechanical polishing of interlayer insulating films formed on semiconductor wafers.

Polishing slurries conventionally used for semiconductor substrate may include, e.g., as disclosed in Japanese Patent Application Laid-open No. 11-111657, an acidic (about pH 3) alumina slurry, a neutral silica slurry having silica particles dispersed therein as abrasive grains, and an alkaline silica slurry prepared by adding sodium hydroxide or the like to this neutral slurry. Besides these, as abrasive grains, this publication further discloses oxide particles such as alumina particles, titanium oxide particles and zirconium oxide particles obtained by hydrolyzing metal alkoxides.

Abrasive grains comprised of metals (inclusive of semi-metals) or metal oxides, used in these conventional polishing slurries, adhere to the surfaces of objects to be polished and to the interiors of polishing apparatus, e.g., to pads, dressers and so forth, and remain thereon after polishing to damage smoothness and film properties unless no measure is taken therefor. Accordingly, as a post treatment of polishing, as disclosed in, e.g., Japanese Patent Application Laid-open No. 9-22885, washing with an alkaline solution or scrubbing washing has been carried out. However, for the abrasive grains comprised of metals (inclusive of semi-metals) or metal oxides, used in these conventional polishing slurries, it has been difficult to be completely removed by washing, and has been very difficult to be removed by washing especially when the abrasive grains stand stuck in the semiconductor substrate.

SUMMARY OF THE INVENTION

Accordingly, an object of the present invention is to provide a polishing slurry whose abrasive grains having remained after polishing are removable with ease, a polishing method and a semiconductor device fabrication process which make use of this polishing slurry.

To achieve the above object, the present invention provides a polishing slurry comprising a dispersion medium and abrasive grains dispersed in the dispersion medium; the abrasive grains comprising a material having a solubility in the dispersion medium at normal temperature (25° C.), of 0.001 g/100 g or higher. The present invention also provides a polishing slurry comprising a dispersion medium and abrasive grains dispersed in the dispersion medium; the abrasive grains comprising organic matter. In either of inorganic matter and organic matter, the abrasive grains may preferably have a solubility in the dispersion medium, of 0.001 g/100 g or higher, and more preferably 0.1 g/100 g or higher. In the case when the abrasive grains are comprised of organic matter, it may preferably have a melting point of 30° C. or above so that it can be present in the state of a solid in usual polishing steps.

The present invention still also provides a polishing method of polishing an object to be poslished by using any of these polishing slurries of the present invention, and a process for fabricating a semiconductor device by using such a method.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE DRAWINGS

Figure 1A:
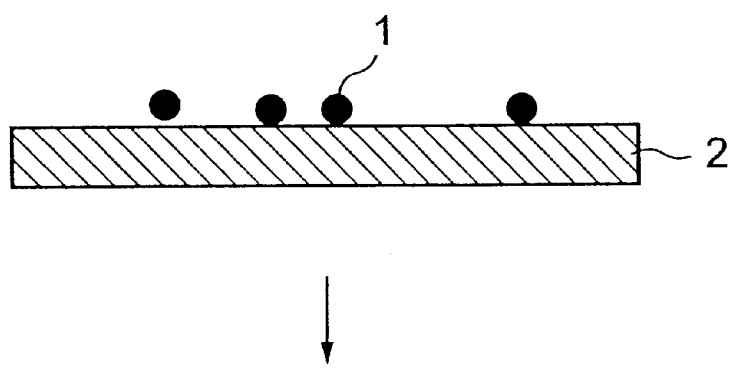
FIG. 1A and FIG. 1B illustrate basic concept of the present invention.

On the abrasive grains contained in the polishing slurry of the present invention, there are no particular limitations as long as they are those having a solubility in its dispersion medium, of 0.001 g/100 g or higher at normal temperature, and capable of being present in the dispersion medium in the state of a solid. They may be comprised of inorganic matter or organic matter, but may preferably be those which do not affect any properties of objects to be polished. For example, when the objects to be polished are semiconductor substrate members, it is preferable to use materials which do not contain sodium, calcium or the like.

Inorganic compounds usable as the abrasive grains in the present invention may include;

Ag compounds such as $AgBr$, $AgCl$, $AgClO_4$, $Ag_2CrO_4$, $AgF$, $AgNO_3$, $Ag_2O$ and $Ag_2SO_4$;

Al compounds such as $AlCl_3$, $Al(NO_3)_3$, $Al_2(SO_4)_3$, $Al(ClO_4)_3 \cdot 9H_2O$, $AlCs(SO_4)_2 \cdot 12H_2O$, $AlF_3 \cdot 3H_2O$, $AlK(SO_4)_2 \cdot 12H_2O$, $AlNH_4(SO_4)_2 \cdot 12H_2O$ and $AlNa(SO_4)_2 \cdot 12H_2O$;

As compounds such as $As_2O_3$;

Ba compounds such as $BaBr_2$, $BaCl_2$, $Ba(ClO_3)_2$, $BaI_2$, $Ba(NO_2)_2$, $Ba(NO_3)_2$, $Ba(OH)_2$, $BaS$ and $BaSO_4$;

Be compounds such as $Be(ClO_4)_2$, $Be(NO_3)_2$ and $BeSO_4$;

Br compounds such as $CaBr_2$;

Ca compounds such as $CaCO_3$, $CaCl_2$, $Ca(ClO_4)_2$, $CaCrO_4$, $CaI_2$, $Ca(IO_3)_2$, $Ca(NO_3)_2$, $Ca(OH)_2$ and $CaSO_4$;

Cd compounds such as $CdBr_2$, $CdCl_2$, $Cd(ClO_3)_2$, $Cd(ClO_4)_2$, $CdI_2$, $Cd(NO_3)_2$ and $CdSO_4$;

Ce compounds such as $Ce_2(SO_4)_3$, $Ce(IO_3)_3$, $Ce_2Mg_3(NO_3)_{12} \cdot 24H_2O$, $Ce(NH_4)_2(NO_3)_5 \cdot 4H_2O$, $Ce(NO_3)_4$; $Ce(NH_4)(NO_3)_6$ and $Ce_2(WO_4)_3$;

Co compounds such as $CoBr_2$, $CoCl_2$, $Co(ClO_3)_2$, $CoI_2$, $Co(NO_3)2$ and $CoSO_4$;

Cr compounds such as $Cr(NO_3)_3$ and $CrO_3$;

Cs compounds such as $CsCl$, $CsClO_3$, $CsClO_4$, $CsI$, $CsNO_3$ and $Cs_2SO_4$;

Cu compounds such as $CuBr_2$, $CuCl_2$, $Cu(ClO_3)_2$, $Cu(NO_3)_2$, $CuSO_4$, $CuCl_2$, $Cu(ClO_4)_2 \cdot 6H_2O$, $CuCrO_4$, $CuF_2 \cdot 2H_2O$, $CuI$, $CuI_2$, $CuK_2(SO_4) \cdot 6H_2O$, $Cu(NH_4)_2Cl_4 \cdot 2H_2O$, $Cu(NH_4)_2(SO_4)_2 \cdot 6H_2O$, $CuSeO_4 \cdot 5H_2O$, $Cu(SiF_6) \cdot 4H_2O$ and $Cu(SO_3 \cdot NH_2)_2$;

Fe compounds such as $FeBr_2$, $FeCl_2$, $FeCl_3$, $Fe(ClO_4)_2$, $Fe(ClO_4)_3$, $Fe(NO_3)_2$, $Fe(NO_3)_3$, $FeSO_4$, $FeF_3 \cdot 3H_2O$, $FeK_2(SO_4)_2 \cdot 6H_2O$, $FeNH_4(SO_4)_2 \cdot 12H_2O$ and $Fe(NH_4)_2(SO_4)_2 \cdot 6H_2O$;

Ge compounds such as $GeO_2$;

B compounds such as $H_3BO_3$;

Cl compounds such as $HClO_4 \cdot H_2O$;

P compounds such as $H_3PO_4$;

Hg compounds such as $HgBr_2$, $HgCl_2$, $Hg_2Cl_2$, and $Hg(ClO_4)_2$;

I compounds such as $I_2$;

In compounds such as $InCl_3$;

K compounds such as $KBr$, $KBrO_3$, $K_2CO_3$, $KCl$, $KClO_3$, $KClO_4$, $K_2CrO_4$, $K_2Cr_2O_7$, $KF$, $K_3[Fe(CN)_6]$, $K_4[Fe(CN)_6]$, $KHCO_3$, $KH_2PO_4$, $K_2HPO_4$, $KI$, $KIO_3$, $KIO_4$, $KMnO_4$, $K_2MnO_4$, $KNO_3$, $KOH$, $K_3PO_4$, $KSCN$, $K_2SO_3$, $K_2SO_4$, $KHF_2$, $KHSO_4$ and $KNO_2$;

La compounds such as $LaCl_3$, $La(NO_3)_3$ and $La_2(SO_4)_3$;

Li compounds such as $LiBr$, $LiBrO_3$, $Li_2CO_3$, $LiCl$, $LiClO_4$, $Li_2CrO_4$, $LiI$, $LiNO_3$, $LiOH$ and $Li_2SO_4$;

Mg compounds such as $MgBr_2$, $MgCO_3$, $MgCl_2$, $Mg(ClO_3)_2$, $Mg(ClO_4)_2$, $MgCrO_4$, $MgMoO_4$, $Mg(NO_3)_2$, $MgSO_3$ and $MgSO_4$;

Mn compounds such as $MnBr_2$, $MnCl_2$, $Mn(NO_3)_2$ and $MnSO_4$;

Mo compounds such as $MoO_3$;

$NH_4$ compounds such as $NH_4Br$, $NH_4Cl$, $NH_4ClO_4$, $(NH_4)_2CrO_4$, $(NH_4)_2Cr_2O_7$, $NH_4F$, $NH_4HCO_3$, $NH_4H_2PO_4$, $(NH_4)_2HPO_4$, $NH_4I$, $NH_4NO_3$, $NH_4SCN$, $(NH_4)_2SO_4$, $(NH_4)_2S_2O_8$, $(NH_3OH)Cl$, $(NH_4)_2CO_3$, $NH_4HF_2$, $NH_4N_3$ and $NH_4NO_3$;

Na compounds such as $NaBO_2$, $NaBr$, $NaBrO_3$, $NaCN$, $Na_2CO_3$, $NaCl$, $NaClO_2$, $NaClO_3$, $NaClO_4$, $Na_2CrO_4$, $Na_2Cr_2O_7$, $NaF$, $Na_4[Fe(CN)_6]$, $NaHCO_3$, $NaH_2PO_4$, $Na_2HPO_4$, $NaI$, $NaIO_3$, $NaMnO_4$, $NaNO_2$, $NaNO_3$, $NaOH$, $Na_4P_2O_7$, $Na_2S$, $NaSCN$, $Na_2SO_3$, $Na_2SO_4$, $Na_2S_2O_3$, $Na_3VO_4$ and $Na_2WO_4$;

Nd compounds such as $NdCl_3$, $Nd(NO_3)_3$ and $Nd_2(SO_4)_3$;

Ni compounds such as $NiBr_2$, $NiCl_2$, $Ni(ClO_3)_3$, $Ni(ClO_4)_2$, $Ni(NO_3)_2$ and $NiSO_4$;

Pb compounds such as $PbBr_2$, $PbCl_2$, $PbI_2$, $Pb(NO_3)_2$ and $PbSO_4$;

Pr compounds such as $PrCl_3$, $Pr(No_3)_3$ and $Pr_2(SO_4)_3$;

Pt compounds such as $PtCl_4$, $[PtCl(NH_3)_5]Cl_3$ and $[Pt(NH_3)_6]Cl_4$;

Rb compounds such as $RbBr$, $RbCl$, $RbClO_3$, $RbClO_4$, $Rb_2CrO_4$, $Rb_2Cr_2O_7$, $RbI$, $RbNO_3$ and $Rb_2SO_4$;

Sb compounds such as $SbCl_3$;

Se compounds such as $SeO_2$;

Sm compounds such as $SmCl_3$;

Sr compounds such as $SrBr_2$, $SrCl_2$, $Sr(ClO_3)_2$, $Sr(ClO_4)_2$, $SrI_2$, $Sr(NO_2)_2$, $Sr(NO_3)_2$, $Sr(OH)_2$ and $SrSO_4$;

Th compounds such as $Th(NO_3)_4$ and $Th(SO_4)_2$;

Tl compounds such as $TlBr$, $TlCl$, $TlClO_4$, $TlNO_2$, $TlNO_3$, $TlOH$ and $TlSO_4$;

U compounds such as $U(SO_4)_2$, $UO_2CrO_4$, $UO_2(NO_3)_2$ and $UO_2SO_4$;

Y compounds such as $YBr_3$, $YCl_3$, $Y(NO_3)_3$ and $Y_2(SO_4)_3$;

Yb compounds such as $Yb_2(SO_4)_3$; and

Zn compounds such as $ZnBr_2$, $ZnCl_2$, $Zn(ClO_2)_2$, $Zn(ClO_3)_2$, $Zn(ClO_4)_2$, $ZnI_2$, $Zn(NO_3)_2$ and $ZnSO_4$.

Of these, it is preferable to use Al compounds, Ce compounds, Cu compounds, Fe compounds and/or $NH_4$ compounds. In particular, $NH_4$ compounds are preferred because they do not deteriorate any semiconductor products. As the most preferred materials for abrasive grains, they may include $NH_4Cl$, $NH_4ClO_4$, $NH_4HCO_3$, $Ce_2(SO_4)$, $CuCl_2$ and $CuSO_4$.

As specific examples of the organic matter usable as the abrasive grains in the present invention, it may include organic acids (organic acids and esters or salts thereof), alcohol compounds, ether compounds, phenolic compounds and nitrogen-containing compounds. These organic compounds are commonly formed of crystals softer than inorganic matter and hence may hardly scratch polishing objects. Thus, these are particularly advantageous for polishing soft objects such as insulating films formed of organic materials or oxides of metals or semi-metals.

The organic acids may include adipic acid, acetylsalicylic acid, salts of benzoic acid (such as potassium benzoate and strychinine benzoate), o-nitrobenzoic acid, p-hydroxybenzoic acid, carbamic esters (such as ethyl carbamate), salts of formic acid (such as potassium formate and magnesium formate dihydrate), citric acid, citric acid hydrate, chloroacetic acid (i.e., α-chloroacetic acid, β-chloroacetic acid or γ-chloroacetic acid), succinic acid, salts of oxalic acid (such as ammonium oxalate and potassium oxalate), oxalic acid hydrate, tartaric acid (i.e., (+)-tartaric acid or (−)-tartaric acid), nicotinic acid, nicotinic acid hydrochloride, maleic acid, malonic acid, DL-mandelic acid, DL-malic acid, salts of valeric acid (such as silver valerate), salts of gluconic acid (such as potassium gluconate), salts of cinnamic acid (such as calcium cis-cinnamate), salts of acetic acid (such as uranyl acetate dehydrate, calcium acetate, cesium acetate, magnesium acetate tetrahydrate and lithium acetate dehydrate), salts of salicylic acid (such as ammonium salicylate, potassium salicylate hydrate), trichloroacetic acid, salts of naphthalene sulfonic acid (such as ammonium 1-naphthalene sulfonate and ammonium 2-naphthalene sulfonate), hippuric acid, hippuric esters (such as ethyl hippurate), salts of phenoxyacetic acid (such as ammonium phenoxyacetate), salts of fumaric acid (such as calcium fumarate trihydrate), salts of butyric acid (such as calcium butyrate hydrate and barium butyrate), and amino acids.

As the amino acids, usable are, e.g., L-ascorbic acid, glycine, DL-α-aminoisobutyric acid, aminobutyric acid (such as DL-α-aminobutyric acid, 3-aminobutyric acid or 4-aminobutyric acid), aminopropionic acid (such as DL-alanine, L-alanine or β-alanine), orotic acid ester salts (such as ethylammonium orotate and benzylammonium orotate), and DL-valine.

The alcohol compounds may include saccharides such as D-glucose, D-glucose hydrate, sucrose and D-mannitol, and salt of glycerophosphoric acid (such as calcium glycerophosphate). The ether compounds may include 18-crown-6. Incidentally, the saccharides listed here are monosaccharides and disaccharides, and may also be trisaccharide or higher polysaccharides.

The phenolic compounds may include catechol, 2-naphthol, m-nitrophenol, hydroquinone, resorcinol, glycidylglycine and pyrogallol.

The nitrogen-containing compounds may include amine compounds, amide compounds, imide compounds, nitro compounds, ammonium salts, and heterocyclic compounds containing nitrogen as a heteroatom. Stated specifically, usable are acetanilide, acetamide, aniline hydrochloride, ethylenediaminetetraacetic acid, caffeine, urea, thiourea, 2,4,6-trinitrotoluene, phenylenediamine (i.e., o-phenylenediamine, α-m-phenylenediamine, β-m-phenylenediamine or p-phenylenediamine), acrylamide, antipyrine, quinine salts (such as quinine hydrochloride dihydrate and quinine sulfate heptahydrate), cocaine hydrochloride, codeine phosphate dehydrate, succinimide hydrate, taurine, tetraethyl ammonium salts (such as tetraethylammonium chloride, tetraethylammonium bromide and tetraethylammonium iodide), tetrapropylammonium salts (such as tetrapropylammonium iodide), tetramethylammonium salts (such as tetramethylammonium bromide and tetramethylammonium iodide), tris(hydroxymethyl) aminomethane, pyrazole, pteridine and hexamethylenetetramine.

Of these, adipic acid, citric acid hydrate and malonic acid are preferred because the metal copper can be prevented from corroding. Sucrose is also preferred because it makes it easy to dispose of waste liquor and does not deteriorate any semiconductor products.

There are no particular limitations on the dispersion medium as long as it is a liquid capable of dissolving these abrasive-grain materials. For example, the following materials (1) to (5) are usable as the dispersion medium.

(1) An acidic solution (preferably pH 2 to 4) containing at least one acid selected from hydrofluoric acid, hydrochloric acid, sulfuric acid, nitric acid, acetic acid and organic acids.
(2) An alkaline solution (preferably pH 9 to 11) containing at least one base selected from ammonium hydroxide, potassium hydroxide, sodium hydroxide and amines.
(3) A solution containing a salt of the above acid with the above base.
(4) Water.
(5) An organic solvent (preferably an aliphatic alcohol having 1 to 5 carbon atoms.

The dispersion medium may optionally further contain hydrogen peroxide and ammonium fluoride, and may also appropriately contain additives such as an anti-corrosive and a dispersant. For the purpose of stable dispersion of the abrasive grains, it is desirable for the abrasive-grain material to stand dissolved in saturation in the dispersion medium. The abrasive-grain material standing dissolved in the dispersion medium may also function as a surface-active agent, a dispersant, an anti-corrosive, a buffer or the like.

In the present invention, the dispersion medium may optionally still further contain at least one of a cationic surface-active agent, an anionic surface-active agent, an amphoteric surface-active agent and an organic solvent. Such various surface-active agents may each be used in a concentration not higher than the critical micellar concentration or not higher than 0.01 mol/L based on the total weight of the dispersant, in order to avoid agglomeration of abrasive grains and ensure a stable dispersibility.

The abrasive grains in the present invention may have any grain diameter without any particular limitations, and may appropriately be determined in accordance with polishing objects, smoothness required, and so forth. To obtain abrasive grains having a specific size, a method is available in which the above abrasive grains, having been dried, are pulverized and then classified with a sieve. Another method is also available in which a solution having the abrasive grains dissolved therein is atomized by means of an atomizer, and the abrasive grains standing atomized are collected and then dried, followed by classification with a sieve.

The abrasive grains in the present invention may be dispersed in the polishing slurry in a quantity (i.e., quantity of abrasive grains present in the form of a solid, per unit volume, or weight, of the polishing slurry) which may appropriately be determined in accordance with polishing objects, smoothness required, polishing rate and so forth, and may preferably be in an amount of from 1 to 50% by weight, and more preferably from 1 to 20% by weight, based on the total weight of the polishing slurry. In order to leave the abrasive grains in the form of a solid without being dissolved in the dispersion medium, the polishing slurry may be prepared by adding the abrasive grains to the dispersion medium in a quantity exceeding the solubility of the abrasive-grain material. Accordingly, the quantity of the abrasive grains used may appropriately be determined in accordance with polishing conditions (the quantity and type of the slurry, pH, temperature, additives and so forth).

The polishing slurry of the present invention makes use of the abrasive grains that can be dissolved in the dispersion medium. Hence, the quantity in which the abrasive grains are dispersed in the polishing slurry can dynamically be changed in the course of polishing, by changing, e.g., the quantity and/or temperature of the dispersion medium. Stated specifically, in the present invention, the quantity of dispersion of the abrasive grains to be dispersed in the polishing slurry in the form of a solid can be changed by changing the quantity of the dispersion medium in the polishing slurry. More specifically, in the present invention, the dispersion medium may be added to the polishing slurry so as to make the abrasive grains dissolve in part in the dispersion medium to lower their quantity of dispersion. Conversely, the dispersion medium may be removed in part from the polishing slurry so as to recrystallize the abrasive-grain material having stood dissolved in the dispersion medium, thus abrasive grains can be made to form anew to make the abrasive grains become dispersed in a larger quantity. Also, the temperature of the polishing slurry may be changed so as to change the solubility of abrasive grains in the dispersion medium to change the quantity of dispersion of the abrasive grains dispersed in the polishing slurry in the form of a solid.

The present invention also provides a polishing method of polishing an object to be polished, by using the polishing slurry of the present invention, and a process for fabricating a semiconductor device by using this polishing method. The polishing slurry of the present invention is suited for polishing electric or electronic materials, magnetic materials and optical materials, such as resins, conductors and ceramics, and is especially suited for polishing conductor films and insulating films, in particular, those of semiconductor devices, wiring substrates and so forth, in the manufacture of electric or electronic apparatus for which a high smoothness and a high cleanness are required.

Figure 1B:
Figure 2A:
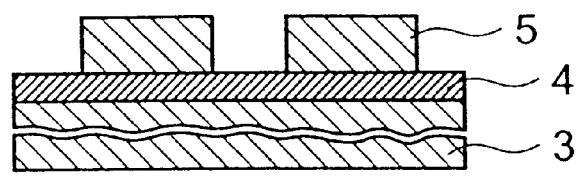
FIG. 2A to FIG. 2D are a cross-sectional views showing some steps in a process of producing a semiconductor substrate.
Figure 2B:
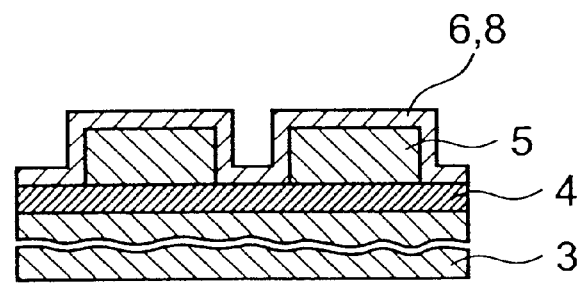
Figure 2C:
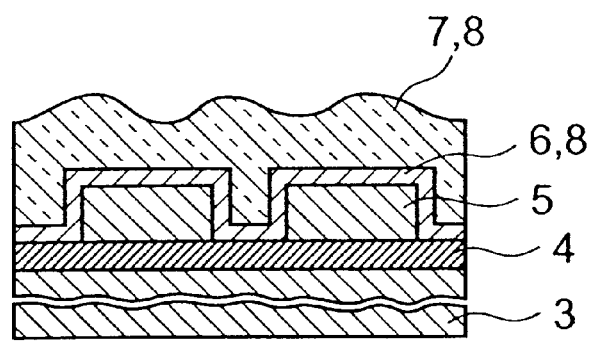
Figure 2D:
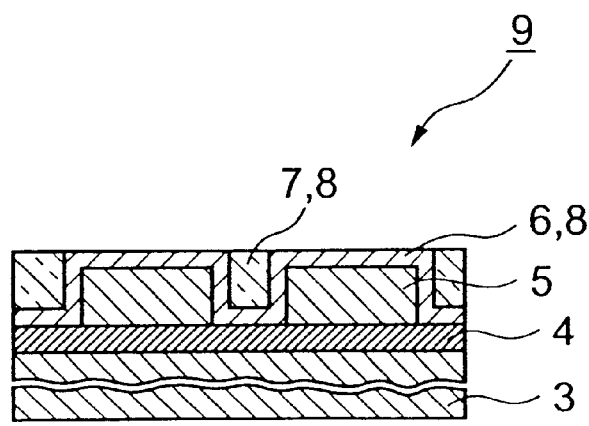

For example, as shown in FIG. 1A, abrasive grains 1 stand adherent to the surface of a semiconductor wafer member 2, after interlayer insulating films such as plasma silicon oxide films, CVD (chemical vapor deposition) silicon oxide films and PVD (physical vapor deposition) silicon oxide films have been smoothed by chemical mechanical polishing. However, according to the present invention, the abrasive-grain material increases in solubility because of the heat generated by polishing, and hence the abrasive grains become dissolved in the dispersion medium, so that the abrasive grains 1 may less adhere to the surface of the object to be polished. Also, the abrasive grains 1 having adhered may be dissolved in a wash liquid, whereby, as shown in FIG. 1B, they can completely be removed with ease. Thus, compared with conventional polishing slurries, a clean polished surface can much more easily be obtained. Incidentally, as the wash liquid, any liquid capable of dissolving the abrasive-grain material, such as the solvent used in the dispersion medium, may appropriately be selected.

According to the present invention, any abrasive grains standing adherent to the surfaces of objects to be polished such as semiconductor substrates or to the interiors of polishing apparatus after polishing can be removed in a good efficiency, and hence semiconductor products and so forth can be manufactured at a low cost, in a high quality and at a high yield. Moreover, according to the present invention, the quantity of dispersion of abrasive grains in the dispersion medium can be controlled with ease, and hence the polishing wear or polishing rate can delicately be controlled. Also, since the abrasive grains can be made to dissolve, the disposal of waste liquid can be made without separating the abrasive grains from the polishing slurry. Incidentally, the present invention is applicable not only to semiconductor wafers but also to substrates of thin-film devices, thin-film disks and the like.

THE PREFERRED EMBODIMENT

Examples of the present invention are given below, which are described with reference to FIG. 2A to FIG. 2D. The present invention is by no means limited to these Examples.

In the present Examples, polishing slurries were prepared in which abrasive grains (grain diameter: 150 nm) comprised of compounds as shown in Table 1 were dispersed in an amount of 30 g per 100 g of polishing slurry, and, using these, oxide films were polished to smooth semiconductor substrate surfaces. In Table 1, the solubility of each compound at normal temperature (25° C.) is shown together.

TABLE 1

|  | Abrasive-grain material | Solubility (%) |  |
|---|---|---|---|
| Example 1 | NH$_4$Cl | 28.2 | Inorganic |
| Example 2 | NH$_4$ClO$_4$ | 21.0 | matter |
| Example 3 | NH$_4$HCO$_3$ | 19.9 |  |
| Example 4 | Ce$_2$(SO$_4$)$_3$ | 7.59 |  |
| Example 5 | CuCl$_2$ | 42.8 |  |
| Example 6 | CuSO$_4$ | 18.2 |  |
| Example 7 | adipic acid | 2.4 | Organic |
|  | citric acid |  | matter |
| Example 8 | monohydrate | 62.0 |  |
| Example 9 | succinic acid | 7.5 |  |
| Example 10 | ammonium oxalate | 5.0 |  |
| Example 11 | sucrose | 67.0 |  |
| Example 12 | malonic acid | 32.2 |  |

(1) Preparation of Polishing Slurry:

First, to a solution prepared by dissolving NH$_4$HCO$_3$ particles saturatedly in an ammonia solution with a pH adjusted to 11, abrasive grains having a primary particle diameter (particle diameter of individual abrasive grains) of 30 nm and a secondary particle diameter (particle diameter of abrasive grains standing agglomerated) of 150 nm were further added in an amount of 30 g per 100 g of polishing slurry, and dispersed therein to obtain each polishing slurry.

(2) Polishing Conditions:

As the polishing apparatus, a polishing apparatus manufactured by Applied Materials, Inc. was used, and polishing objects were polished setting the number of revolutions of the head at 90 rpm and the number of revolutions of the platen at 90 rpm and feeding a 25° C. polishing slurry at a feed rate of 200 mL/minute. Here, polishing temperature was controlled to 25° C. so that the liquid temperature did not rise during polishing.

(3) Production of Semiconductor Substrate Member:

First, as shown in FIG. 2, an oxide film 4 was formed on a semiconductor substrate 3, and an Al wiring 5 was further formed thereon to produce a semiconductor substrate member having a difference in height at the surface [FIG. 2, (a)]. On the surface of this substrate member, a silicon nitride film 6 serving as a polishing stopper layer was so formed as to cover the uncovered surfaces of the oxide film 4 and wiring 5 [FIG. 2, (b)].

Subsequently, an oxide film 7 was so formed by CVD as to fill up the difference in height that was formed by the wiring 5 [FIG. 2, (c)]. Thereafter, by means of the polishing apparatus, this oxide film 7 was so polished as to provide a smooth surface, using the polishing slurry prepared in the above step (1). Thus, a semiconductor substrate member 9 having an interlayer insulating film 8 having a smooth surface was obtained.

Finally, this substrate member 9 was washed with water by means of a brush washing assembly manufacture by Dainippon Screen Mfg. Co., Ltd. to remove abrasive grains remaining thereon, and thereafter the surface of the oxide film 7 was observed with an optical microscope and a scanning electron microscope. As the result, neither scratch nor abrasive grain buried in the oxide film 7 was seen, and it was confirmable that the oxide film 7 was provided with a good smoothness when any polishing slurries of Examples 1 to 12 were used.

Percentage of rejects of semiconductor substrate members obtained in the respective Examples was smaller by 5% than a case in which substrate members were polished using a conventional polishing slurry (silica particles of a primary particle diameter of 30 nm and a secondary particle diameter of 150 nm were used as abrasive grains, which were dispersed in an ammonia solution with a pH adjusted to 11) Thus, it has become apparent that the polishing slurries of the above Examples enable manufacture of semiconductor products in a high quality and at a high yield.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications fall within the ambit of the appended claims.

What is claimed is:

1. A method for polishing a surface of a semiconductor substrate member, comprising:
    polishing said surface using a polishing slurry comprising a dispersion medium and abrasive grains dispersed in the dispersion medium, said abrasive grains consisting of a crystal material precipitated in said dispersion medium and having a solubility in the dispersion medium, at 25° C., of at least 0.001 g/100 g.

2. The method according to claim 1, wherein said abrasive grains contain at least one selected from the group consisting of Ag compounds, Al compounds, As compounds, Ba compounds, Be compounds, Br compounds, Ca compounds, Cd compounds, Ce compounds, Co compounds, Cr compounds, Cs compounds, Cu compounds, Fe compounds, Ge compounds, B compounds, Cl compounds, P compounds, Hg compounds, In compounds, K compounds, Li compounds, Mg compounds, Mn compounds, Mo compounds, $NH_4$ compounds, Na compounds, Nd compounds, Ni compounds, Pb compounds, Pr compounds, Pt compounds, Rb compounds, Sb compounds, Se compounds, Sm compounds, Sr compounds, Th compounds, Tl compounds, U compounds, Y compounds, Yb compounds, Zn compounds and $I_2$.

3. The method according to claim 1, wherein said abrasive grains are comprised of organic material having a melting point of at least 30° C., wherein said organic material contains at least one selected from the group consisting of organic acids, organic acid esters, organic acid salts, ammonium oxalate, alcohol compounds, ether compounds, phenolic compounds and nitrogen-containing compounds.

4. The method according to claim 1, wherein said dispersion medium is:
   (1) an acidic solution containing at least one acid selected from the group consisting of hydrofluoric acid, hydrochloric acid, sulfuric acid, nitric acid, acetic acid and organic acids other than acetic acid;
   (2) an alkaline solution containing at least one base selected from the group consisting of ammonium hydroxide, potassium hydroxide, sodium hydroxide and amines;
   (3) a solution containing a salt of the above acid with the above base;
   (4) water; or
   (5) an organic solvent.

5. The method for polishing a surface of a semiconductor substrate member, comprising:
   polishing said surface using a polishing slurry that comprises a dispersion medium and abrasive grains dispersed in the dispersion medium, wherein the abrasive grains are a crystal precipitated in said dispersion medium
   wherein said abrasive grains may be dissolved in part in the dispersion medium, so as to vary the quantity of dispersion of the abrasive grains dispersed in the polishing slurry in the form of a solid.

6. The method for polishing a surface of a semiconductor substrate member, comprising:
   polishing said surface using a polishing slurry that comprises a dispersion medium and abrasive grains dispersed in the dispersion medium, wherein the abrasive grains are a crystal precipitated in said dispersion medium and
   wherein the solubility of the abrasive grains in the dispersion medium is varied by changing the temperature of the polishing slurry, so as to vary the quantity of dispersion of the abrasive grains dispersed in the polishing slurry in the form of a solid.

7. The method of claim 1 wherein the polishing slurry is a saturated solution of compounds of said abrasive grains in said dispersion medium.

8. The method of claim 5 wherein the polishing slurry is a saturated solution of compounds of said abrasive grains in said dispersion medium.

9. The method of claim 6 wherein the polishing slurry is a saturated solution of compounds of said abrasive grains in said dispersion medium.

10. The process of claim 1 wherein the polishing slurry does not contain a substance having a solubility in the dispersion medium at 25° C. of 0.001 g/100 g or lower.

11. The process of claim 1 wherein the abrasive grains are made of a material selected from the group consisting of $NH_4Cl$, $NH_4ClO_4$, $NH_4HCO_3$, $Ce_2(SO_4)_3$, $CuCl_2$, $CuSO_4$, adipic acid, citric acid monohydrate, succinic acid, ammonium oxalate, sucrose, and malonic acid.

* * * * *